(12) United States Patent
Jeng et al.

(10) Patent No.: US 9,406,650 B2
(45) Date of Patent: Aug. 2, 2016

(54) METHODS OF PACKAGING SEMICONDUCTOR DEVICES AND PACKAGED SEMICONDUCTOR DEVICES

(71) Applicant: Taiwan Semiconductor Manufacturing Company, Ltd., Hsin-Chu (TW)

(72) Inventors: Shin-Puu Jeng, Hsin-Chu (TW);
Wen-Chih Chiou, Zhunan Township (TW); Tu-Hao Yu, Hsin-Chu (TW);
Hung-Jung Tu, Hualien (TW);
Yu-Liang Lin, Hsin-Chu (TW);
Shih-Hui Wang, Zhonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/257,833

(22) Filed: Apr. 21, 2014

(65) Prior Publication Data

US 2015/0221611 A1    Aug. 6, 2015

Related U.S. Application Data

(60) Provisional application No. 61/934,467, filed on Jan. 31, 2014.

(51) Int. Cl.
*H01L 21/00* (2006.01)
*H01L 25/065* (2006.01)
(Continued)

(52) U.S. Cl.
CPC .......... *H01L 25/0655* (2013.01); *H01L 21/563* (2013.01); *H01L 21/565* (2013.01); *H01L 23/3107* (2013.01); *H01L 24/09* (2013.01); *H01L 24/17* (2013.01); *H01L 24/81* (2013.01); *H01L 24/89* (2013.01); *H01L 25/50* (2013.01); *H01L 2224/0401* (2013.01); *H01L 2224/08235* (2013.01); *H01L 2224/16225* (2013.01); *H01L 2224/16227* (2013.01); *H01L 2224/16235* (2013.01); *H01L 2224/80805* (2013.01); *H01L 2224/81805* (2013.01); *H01L 2924/01013* (2013.01); *H01L 2924/01014* (2013.01); *H01L 2924/01022* (2013.01); *H01L 2924/01029* (2013.01); *H01L 2924/01073* (2013.01);
(Continued)

(58) Field of Classification Search
CPC .................. H01L 2924/181; H01L 2924/151; H01L 2924/161; H01L 21/563; H01L 23/3107
See application file for complete search history.

(56) References Cited

U.S. PATENT DOCUMENTS 5,151,776 A      9/1992   Wojnarowski et al.
5,258,649 A *   11/1993   Tanaka .................. H01L 21/565
                                                        257/707

(Continued)

OTHER PUBLICATIONS

Xie, J. Y., et al., "Interposer Integration through Chip on Wafer on Substrate Process (CoWoS)," Semicon West 2012, Jul. 10-12, 2012, Moscone Center, San Francisco, California, 14 pages.

(Continued)

*Primary Examiner* — Ngan Ngo
(74) *Attorney, Agent, or Firm* — Slater Matsil, LLP (57) ABSTRACT

Methods of packaging semiconductor devices and packaged semiconductor devices are disclosed. In some embodiments, a method of packaging semiconductor devices includes coupling integrated circuit dies to a substrate, and disposing a molding material around the integrated circuit dies. A cap layer is disposed over the molding material and the plurality of integrated circuit dies.

20 Claims, 5 Drawing Sheets

(51) Int. Cl.
*H01L 25/00* (2006.01)
*H01L 21/56* (2006.01)
*H01L 23/31* (2006.01)
*H01L 23/00* (2006.01)

(52) U.S. Cl.
CPC ............... *H01L2924/01074* (2013.01); *H01L 2924/0496* (2013.01); *H01L 2924/04941* (2013.01); *H01L 2924/04953* (2013.01); *H01L 2924/12042* (2013.01); *H01L 2924/151* (2013.01); *H01L 2924/161* (2013.01); *H01L 2924/181* (2013.01)

(56) References Cited

U.S. PATENT DOCUMENTS

| | | | | |
|---|---|---|---|---|
| 5,801,452 | A * | 9/1998 | Farnworth | H01L 23/13 257/797 |
| 6,144,101 | A * | 11/2000 | Akram | H01L 23/50 257/707 |
| 6,518,666 | B1 * | 2/2003 | Ikeda | H01L 23/3735 257/706 |
| 8,362,607 | B2 * | 1/2013 | Scheid | H01L 21/561 257/704 |
| 8,643,148 | B2 | 2/2014 | Lin et al. | |
| 2002/0074649 | A1 * | 6/2002 | Chrysler | H01L 23/36 257/720 |
| 2003/0168256 | A1 | 9/2003 | Chien | |
| 2004/0124515 | A1 * | 7/2004 | Tao et al. | 257/684 |
| 2005/0098878 | A1 * | 5/2005 | Yu | H01L 51/529 257/706 |
| 2005/0151554 | A1 * | 7/2005 | Rae | H01L 23/36 324/750.03 |
| 2008/0099909 | A1 * | 5/2008 | Baek | H01L 23/427 257/715 |
| 2008/0258133 | A1 * | 10/2008 | Seong | H01L 33/04 257/14 |
| 2009/0072382 | A1 | 3/2009 | Guzek | |
| 2009/0294938 | A1 * | 12/2009 | Chen | 257/676 |
| 2011/0018114 | A1 * | 1/2011 | Pagaila | H01L 21/561 257/686 |
| 2011/0278703 | A1 | 11/2011 | Pagaila et al. | |
| 2011/0285005 | A1 * | 11/2011 | Lin et al. | 257/686 |
| 2012/0119346 | A1 * | 5/2012 | Im et al. | 257/690 |
| 2012/0126395 | A1 * | 5/2012 | Lee et al. | 257/737 |
| 2012/0326325 | A1 * | 12/2012 | Choi et al. | 257/774 |
| 2013/0052775 | A1 * | 2/2013 | Kim et al. | 438/118 |
| 2013/0200528 | A1 * | 8/2013 | Lin et al. | 257/774 |
| 2013/0273694 | A1 * | 10/2013 | Hsieh et al. | 438/113 |
| 2013/0277821 | A1 * | 10/2013 | Lundberg | 257/713 |
| 2013/0341786 | A1 * | 12/2013 | Hsu | H01L 21/4857 257/737 |
| 2014/0048906 | A1 * | 2/2014 | Shim et al. | 257/531 |
| 2014/0103527 | A1 * | 4/2014 | Marimuthu et al. | 257/737 |
| 2014/0138819 | A1 * | 5/2014 | Choi et al. | 257/737 |
| 2014/0210101 | A1 * | 7/2014 | Lin et al. | 257/774 |
| 2014/0252599 | A1 | 9/2014 | Kwon et al. | |
| 2015/0001708 | A1 * | 1/2015 | Lin | 257/737 |
| 2015/0061101 | A1 * | 3/2015 | Le et al. | 257/676 |
| 2015/0097277 | A1 * | 4/2015 | Chen et al. | 257/668 |
| 2015/0214133 | A1 * | 7/2015 | Otremba | H01L 23/4093 257/718 |

OTHER PUBLICATIONS

Wolf, Stanley, Silicon Processing for the VLSI Era, vol. 2: Process Integration, Lattice Press, Sunset Beach, CA, 1990, pp. 127-128.

* cited by examiner

METHODS OF PACKAGING SEMICONDUCTOR DEVICES AND PACKAGED SEMICONDUCTOR DEVICES

PRIORITY CLAIM AND CROSS-REFERENCE

This application claims priority to U.S. Provisional Application Ser. No. 61/934,467, filed on Jan. 31, 2014 and entitled "Equal Potential Method at Chip on Wafer," which application is hereby incorporated herein by reference.

This application also relates the following commonly-assigned U.S. Patent application: application Ser. No. 14/243,517, filed on Apr. 2, 2014 and entitled "Semiconductor Device and Method,", which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications. Chip on wafer (CoW) packages are one type of smaller packaging device for semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide novel methods of packaging semiconductor devices and structures thereof, wherein a cap layer comprising a conductive material is disposed over integrated circuit dies and a molding material, which provides a substantially equal potential of the integrated circuit dies that are packaged together over a substrate.

Figure 1:
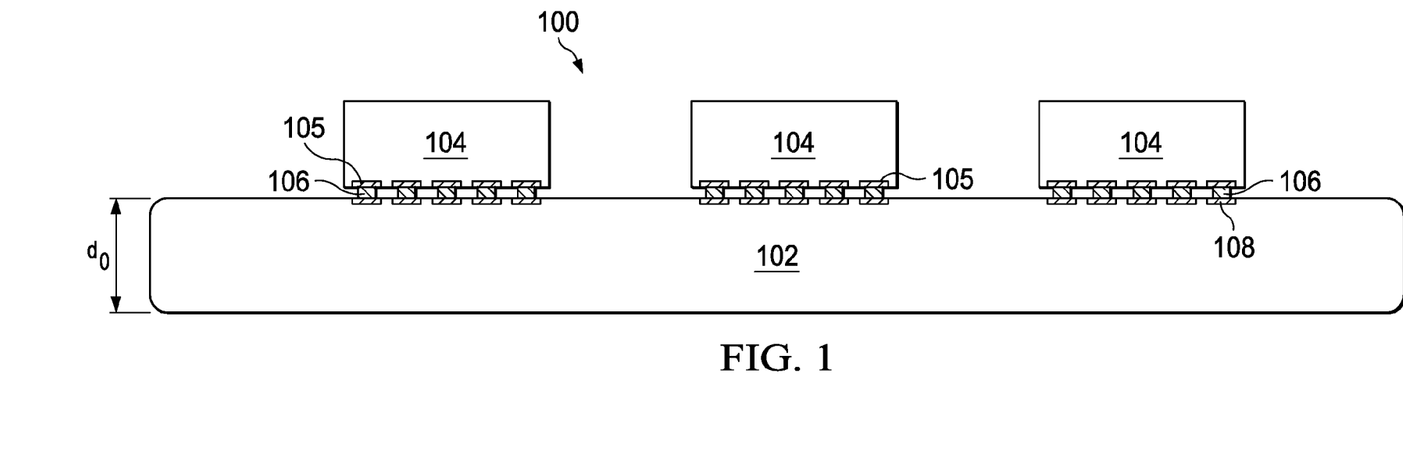
FIGS. 1 through 5 are cross-sectional views illustrating a method of packaging semiconductor devices in accordance with some embodiments, wherein a conductive cap layer is disposed over integrated circuit dies and a molding material coupled over a substrate.

FIGS. 1 through 5 are cross-sectional views illustrating a method of packaging semiconductor devices in accordance with some embodiments. A packaged semiconductor device 100 at various stages of the packaging process is shown. Referring first to FIG. 1, a substrate 102 is provided. The substrate 102 may comprise a semiconductor material such as silicon, glass, a polymer, other materials, and/or combinations thereof, in some embodiments, for example. In some embodiments, the substrate 102 may include one or more passive components (not shown) embedded inside. In some embodiments, a plurality of substrates 102 may be manufactured on a wafer, board, or strip, for example. The substrate 102 comprises an interposer substrate in some embodiments. The substrate 102 includes one or more interconnect structures in some embodiments, such as redistribution layers (RDLs) or post-passivation interconnect (PPI) structures (not shown in FIG. 1; refer to interconnect structures 124a and 124b shown in FIG. 6). The substrate 102 may include a plurality of through-vias formed therein (also not shown in FIG. 1; see through-vias 128 shown in FIG. 6). Alternatively, the substrate 102 may comprise other materials and/or components. The substrate 102 is also referred to herein as a first package substrate.

Figure 2:
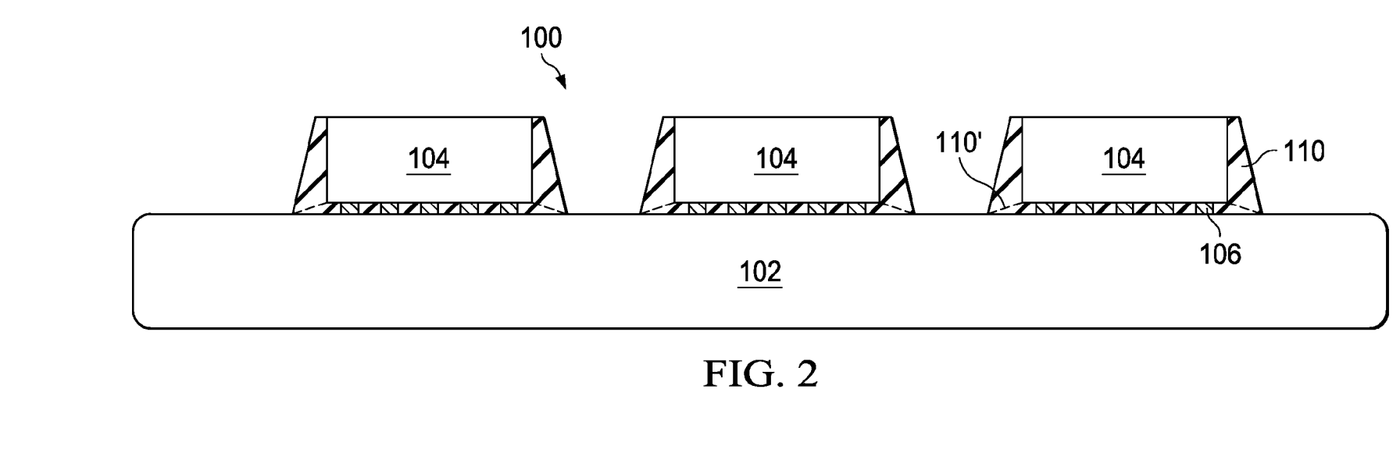
Figure 3:
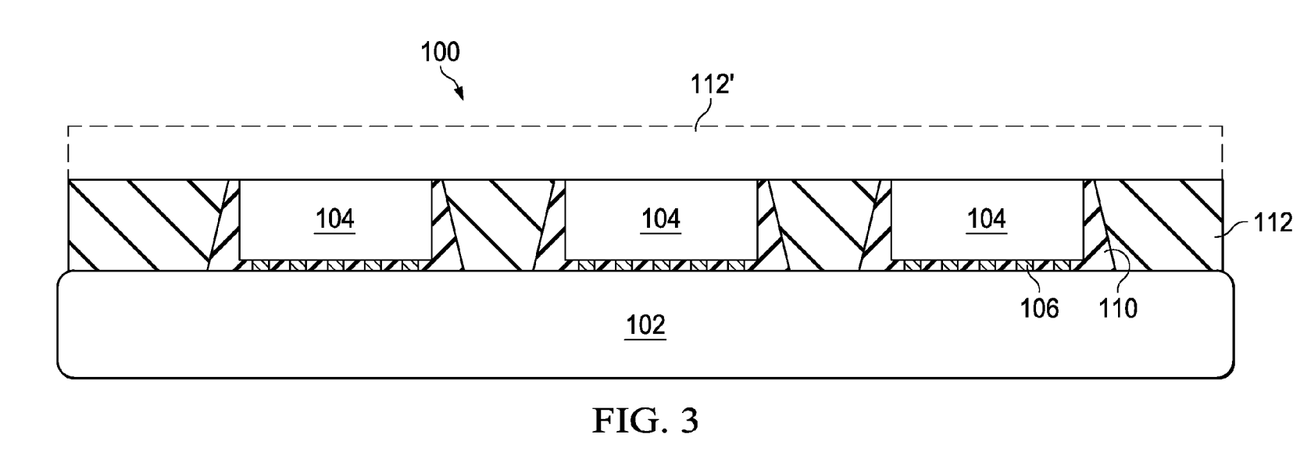

In some embodiments, the substrate 102 has not been fully processed in the packaging steps shown in FIGS. 1 through 3. For example, the substrate 102 includes a previously formed interconnect structure 124a (see FIG. 6). The substrate 102 also includes through-vias 128 that have been formed partially yet not fully through the substrate 102 in some embodiments. The substrate 102 comprises an initial thickness comprising dimension $d_0$ in some embodiments. Dimension $d_0$ may comprise about 50 µm to about 1,000 µm, for example. Alternatively, dimensions $d_0$ may comprise other values.

Referring again to FIG. 1, a plurality of integrated circuit dies 104 are provided. The integrated circuit dies 104 may be previously fabricated on a semiconductor wafer and singulated along scribe lines to form individual dies, for example. Some or all of the integrated circuit dies 104 may comprise the same or similar functions, or alternatively, some or all of the integrated circuit dies 104 may comprise different functions. The integrated circuit dies 104 may comprise logic chips, memory chips, processors, application specific devices, or other functions, as examples. The integrated circuit dies 104 comprise dies 104 that will be packaged together in a single packaged semiconductor device 100, in some embodiments. One or more types of integrated circuit dies 104 may be packaged in a single packaged semiconductor device 100 to form a system on a chip (SoC) device.

The integrated circuit dies 104 are attached to predetermined locations of the substrate 102 using an automated machine such as a pick and place machine. Alternatively, the integrated circuit dies 104 may be placed manually on the substrate 102 or by other methods. In some embodiments, the integrated circuit dies 104 include a plurality of contact pads 105 formed thereon, and the substrate 102 includes a plurality of contact pads 108 formed thereon that are arranged in substantially the same pattern (i.e., footprint) as the contact pads 105 on the integrated circuit dies 104. The contact pads 105 and 108 may comprise Cu, Al, other conductive materials or metals, or multiple layers or combinations thereof, as examples. The contact pads 105 and 108 are not included in FIGS. 2 through 7 for simplicity; however, the contact pads 105 and 108 may also be included in the structures shown in FIGS. 2 through 7.

The integrated circuit dies 104 are bonded to the substrate 102 when the substrate 102 is in a wafer form, in some embodiments; thus, the combined structure of the packaged semiconductor device 100 comprises a chip on wafer (CoW) configuration.

To couple the integrated circuit dies 104 to the substrate 102, a eutectic material such as solder is formed on the contact pads 105 of the integrated circuit dies 104, on the contact pads 108 of the substrate 102, or on both the contact pads 105 of the integrated circuit dies 104 and the contact pads 108 of the substrate 102, in some embodiments. The eutectic material may comprise solder balls or solder paste in some embodiments. The eutectic material is reflowed by heating the eutectic material 106 (e.g., by heating the substrate 102 and/or integrated circuit dies 104) to a melting temperature of the eutectic material 106, and the eutectic material is then allowed to cool and re-solidify, forming connectors 106 between the contact pads 105 and 108 of the integrated circuit dies 104 and the substrate 102, respectively.

The connectors 106 electrically and mechanically couple the integrated circuit dies 104 to the substrate 102. The connectors 106 may include other types of electrical connectors, such as microbumps, controlled collapse chip connection (C4) bumps, or pillars, and may include conductive materials such as Cu, Sn, Ag, Pb, or the like. In some embodiments, the connectors 106 may comprise joined bumps, as another example.

Each of the plurality of integrated circuit dies 104 is mounted on the substrate 102 using a plurality of electrical connections such as contact pads 105. The plurality of electrical connections may comprise any suitable structure. For example, in some embodiments, the electrical connections may include conductive pads, under bump metallization (UBM) structures, and/or the like. Thus, the integrated circuit dies 104 are coupled to the substrate 102 by the plurality of connectors 106 disposed between contact pads 105 on the integrated circuit dies 104 and contact pads 108 on the substrate 102, in some embodiments.

An underfill material 110 disposed beneath the integrated circuit dies 104 in some embodiments, as shown in FIG. 2. The underfill material 110 may extend along at least a portion of a sidewall of the integrated circuit dies 104. The underfill material 110 provides structural and environmental protection to the integrated circuit dies 104, the connectors 106, and the substrate 102. The underfill material 110 comprises an epoxy, deformable gel, silicon rubber, or other materials that is in a substantially liquid state when applied. The underfill material 110 is injected in the space between the integrated circuit dies 104 and the substrate 102 between the connectors 106 in some embodiments, for example. The underfill material 110 may be dispensed using a needle or other object along one or more edges of the integrated circuit die 104. The underfill material 110 may alternatively comprise other materials and may be applied using other methods. The underfill material 110 is cured and/or allowed to harden in some embodiments. The underfill material 110 provides stress relief and prevents cracks in the connectors 106, for example. In some embodiments, the underfill material 110 is not included.

In the drawings, the underfill material 110 is shown extending to top surfaces of the integrated circuit dies 104. In some embodiments, the underfill material 110 is applied only along the bottom of the integrated circuit dies 104 around the perimeter of the integrated circuit dies 104, as shown in phantom (e.g., in dashed lines) at 110' in FIG. 2.

A molding material 112 is disposed around the integrated circuit dies 104 and around the underfill material 110, as shown in FIG. 3. The molding material 112 may be molded using, for example, compressive molding, transfer molding, or other methods. The molding material 112 is applied after the underfill material 110 is applied beneath the integrated circuit dies 104 in some embodiments. The molding material 112 encapsulates the integrated circuit dies 106, for example. The molding material 112 may comprise an epoxy, an organic polymer, or a polymer with or without a silica-based or glass filler added, as examples. In some embodiments, the molding material 112 comprises a liquid molding compound (LMC) that is a gel type liquid when applied. Alternatively, the molding material 112 may comprise other insulating and/or encapsulating materials.

In some embodiments, the molding material 112 is applied so that it extends to top surfaces of the integrated circuit dies 104. The top surface of the molding material 112 is substantially coplanar with top surfaces of the integrated circuit dies 104 in some embodiments, for example. If the molding material 112 extends over top surfaces of the integrated circuit dies 104 after the molding material 112 is applied, as shown in phantom at 112' in FIG. 3, the molding material 110 is removed from over the top surfaces of the integrated circuit dies 104 using a grinding process, a chemical-mechanical polish (CMP) process, an etch process, other methods, or combinations thereof, in some embodiments, for example. The CMP process or other removal process is adapted to stop on the top surfaces of the integrated circuit dies 104, for example. The molding material 112 is formed between and around the integrated circuit dies 104 and the underfill material 110 in some embodiments.

Next, the molding material 112 is cured using a curing process. The curing process may comprise heating the molding material 112 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 112 may be cured using other methods.

Figure 4:
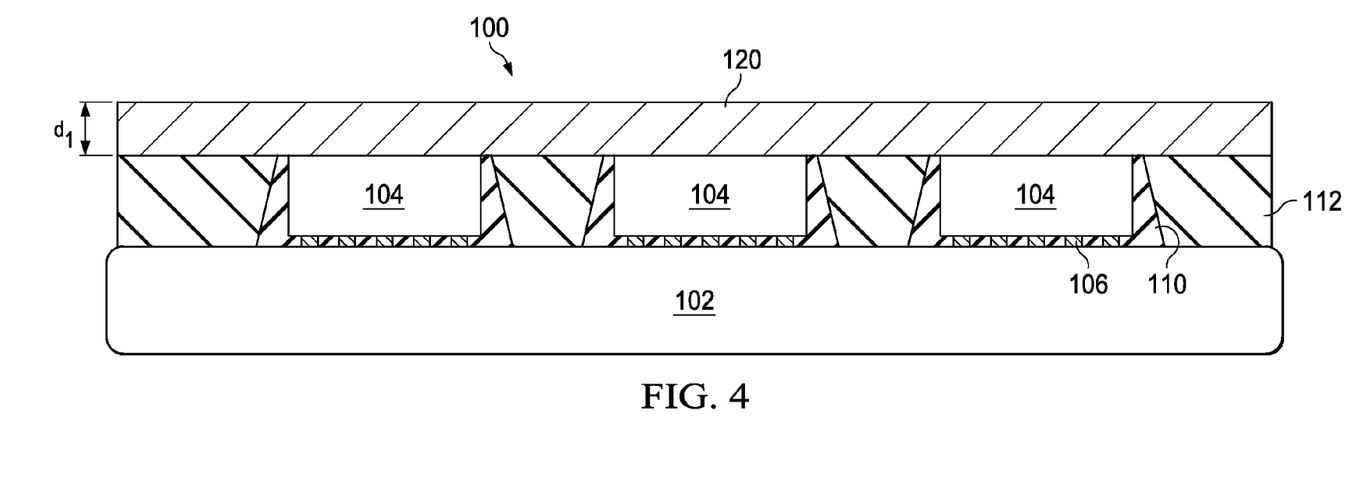

A cap layer 120 is coupled over each of the integrated circuit dies 104 and the molding material 112, as shown in FIG. 4. The cap layer 120 is coupled directly in contact with a top surface of the integrated circuit dies 104 and also directly in contact with the top surface of the molding material 112. The cap layer 120 is continuous and comprises a conductive material in some embodiments. The cap layer 120 is a continuous layer that extends over and is adjacent to each of the plurality of integrated circuit dies 104 in some embodiments. Such embodiments provide a single surface that reduces cross-contamination and provides a more uniform or equal potential at the integrated circuit dies 104 in the packaged semiconductor device 100, thereby lowering electrical over stress (EOS) risk.

The cap layer 120 comprises a material having a lower resistance than a material of the integrated circuit dies 104 and/or the molding material 112 in some embodiments. The cap layer 120 is more conductive than a material of the integrated circuit dies 104 and the molding material 112, for example. In some embodiments, cap layer 120 is conductive in order to provide a substantially equal potential across the integrated circuit dies 104 and across the molding material 112. By providing an equal potential, any charge build-up that may occur during the packaging process (which could damage or destroy one or more of the integrated circuit dies 104) may be equalized across integrated circuit dies 104 and the molding material 112, which facilities in reducing or eliminating damage or other deleterious effects that may result from an unequal charge distribution. The cap layer 120 creates a substantially equal potential for each of the integrated circuit dies 104 disposed across the substrate 102 in some embodiments, for example.

The cap layer 120 comprises a substantially flat planar layer in some embodiments. For example, the integrated circuit dies 104 are substantially coplanar with the top surface of the molding material 112 across the substrate 102, and the cap layer 120 comprises the same flat topography as the underlying integrated circuit dies 104 and molding material 112. Thus, the bottom surface and top surface of the cap layer 120 comprise substantially flat surfaces, in some embodiments.

The cap layer 120 comprises a metal, a conductive polymer, or a semiconductive material in some embodiments. The cap layer 120 comprise Cu, Al, Ti, Si, TiN, Ta, TaN, W, WN, other materials, or combinations or multiple layers thereof, as examples. In some embodiments, the cap layer 120 comprises a thin Ti layer. The cap layer 120 may be formed using physical vapor deposition (PVD), chemical vapor deposition (CVD), plasma enhanced chemical vapor deposition (PECVD), atomic layer deposition (ALD), or other methods, for example.

The cap layer 120 comprises a thickness comprising dimension $d_1$, wherein dimension $d_1$ comprises about 500 Angstroms to about 2,000 Angstroms in some embodiments. Alternatively, dimension $d_1$ may comprise other values. For example, the cap layer 120 comprises a thickness such that the cap layer 120 is adapted to equalize charge for the plurality of integrated circuit dies 104 attached across the top surface of the substrate 102.

Figure 5:
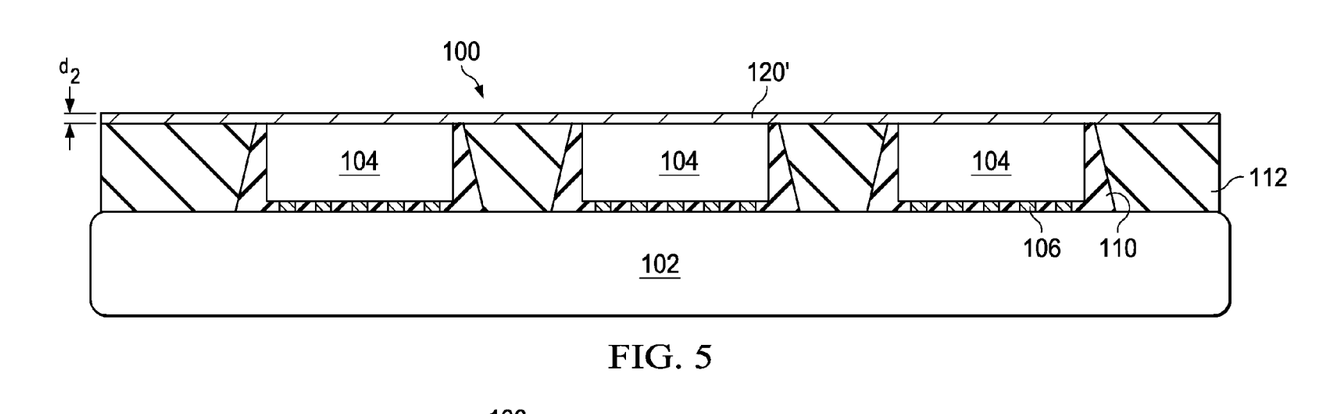
Figure 6:
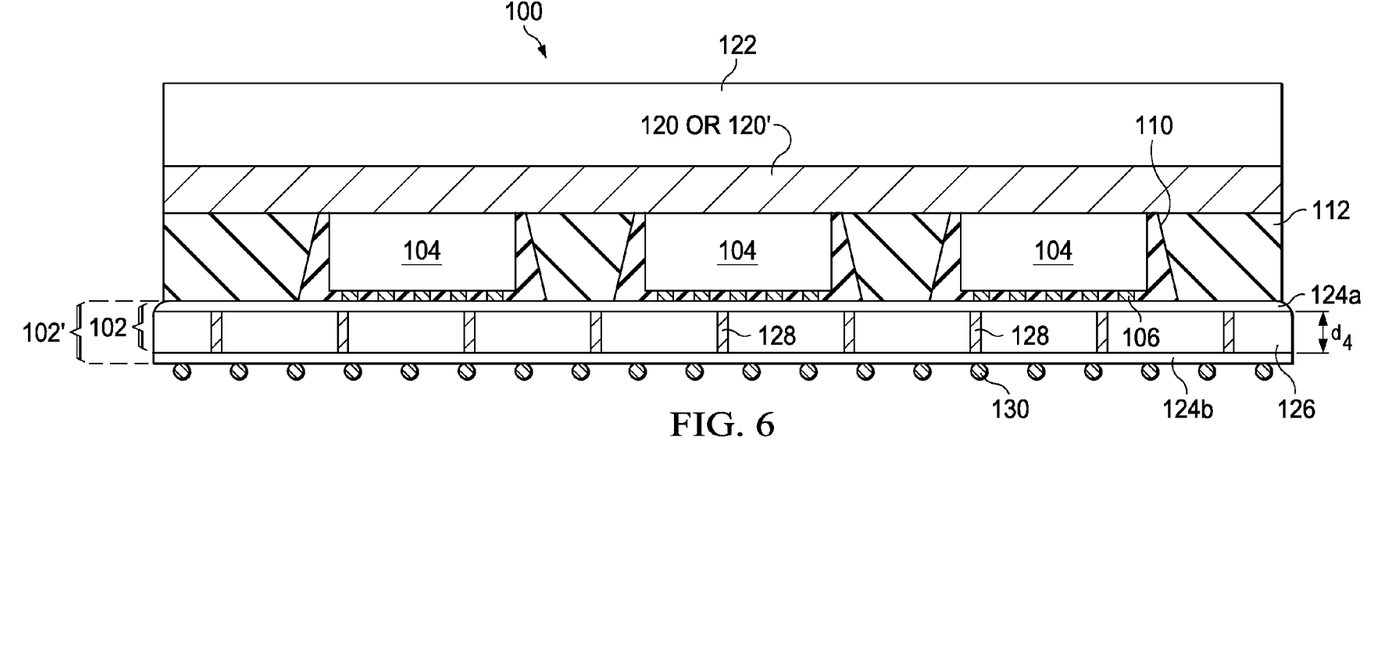
FIG. 6 is a cross-sectional view illustrating a method of packaging semiconductor devices in accordance with some embodiments, wherein the substrate comprises an interposer substrate.

In some embodiments, the integrated circuit dies 104 are coupled to a first surface of the substrate 102 (e.g., to the top surface of the substrate 102 in the views shown in FIGS. 1 through 5), and after the cap layer 120 is coupled over the molding material 112 and the integrated circuit dies 104, a second surface (e.g., the bottom surface of the substrate 102) of the substrate 102 is processed, wherein the second surface is opposite the first surface (to be described further herein with reference to FIG. 6). The second surface of the substrate 102 may be processed using a process such as thinning the second surface of the substrate 102, forming an interconnect structure over the second surface of the substrate 102, forming a passivation material over the second surface of the substrate 102, and/or forming a plurality of connectors over the second surface of the substrate 102. Alternatively, the second surface of the substrate 102 may be processed using other types of processes after the cap layer 120 is applied.

In other embodiments, the substrate 102 is not processed after the cap layer 120 is applied. For example, the substrate 102 may require no additional processing steps after the formation of the cap layer 120 in some embodiments.

In some embodiments, after the second surface of the substrate 102 is processed, a process is performed to remove the cap layer 120, as shown in FIG. 5. The cap layer 120 is removed using a process such as an etch process suitable for the material of the cap layer 120. As an example, in embodiments wherein the cap layer 120 comprises Ti, the etch process to remove the cap layer 120 may comprise a base or acid type of chemistry. Alternatively, other methods or chemicals may be used to remove the cap layer 120.

In some embodiments, a portion 120' of the cap layer 120 is left remaining over the molding material 112 and the integrated circuit dies 104, after performing the process to remove the cap layer 120, as shown in FIG. 5. The portion 120' of the cap layer 120 remains because a stable metal silicide is naturally formed in some embodiments, for example. The portion 120' of the cap layer 120 comprises a continuous ultra-thin metal or conductive material left remaining over the integrated circuit dies 104 and the molding compound 112. The thickness of the portion 120' of the cap layer 120 left remaining may comprise a dimension $d_2$, wherein dimension $d_2$ comprises about 100 Angstroms or less, for example. Alternatively, dimension $d_2$ may comprise other values. In some embodiments, dimension $d_2$ comprises about zero; e.g., substantially all of the cap layer 120' may be removed.

In embodiments wherein the cap layer 120 or the portion 120' of the cap layer 120 is left remaining, a substantially equal potential for the integrated circuit dies 104 continues to be provided by the cap layer 120 or portion 120' of the cap layer 120 in some embodiments, advantageously. For example, in embodiments wherein about 20 Angstroms to about 100 Angstroms of the cap layer 120 is left remaining, a sufficient amount of the cap layer 120 remains to equalize the potential for the integrated circuit dies 104, in some embodiments. The sufficient amount of the cap layer 120 left remaining is a function of the material used for the cap layer 120 and the resistance and/or conductivity of the material, for example.

An experiment of implementing a cap layer 120 comprising Ti described herein over integrated circuit dies 104 and a surrounding molding material 112, and removing the Ti cap layer 120 after backside processing of the substrate 102 resulted in an ultra-thin metal comprising Ti being left remaining, which was observed by transmission electron microscope (TEM) imaging. Furthermore, the packaging approach described herein was implemented with no integrated circuit die 104 damage by EOS or electro-static discharge (ESD).

FIG. 6 illustrates a method of packaging semiconductor devices in accordance with some embodiments. The substrate 102 comprises an interposer substrate in some of the embodiments shown in FIG. 6, for example. A backside process for the interposer substrate 102 is performed after the packaging steps shown in FIGS. 1 through 5 in some embodiments, as shown in FIG. 6. After the packaging process step shown in FIG. 4 or 5, a carrier 122 is coupled to the cap layer 120 or to the portion 120' of the cap layer 120 using a temporary adhesive, not shown. The carrier 122 may comprise glass, silicon oxide, aluminum oxide, or a semiconductor wafer, as examples. The carrier 122 may also comprise other materials.

FIG. 6 also illustrates a more detailed view of the substrate 102 in accordance with some embodiments. The substrate 102 comprises an interposer substrate that includes a plurality of through-vias 128 and an interconnect structure 124a coupled to the plurality of through-vias 128 at the upper ends of the plurality of through-vias 128. In some embodiments, the substrate 102 only includes the interconnect structure 124a and through-vias 128 formed in a core substrate 126 during the packaging process steps shown in FIGS. 1 through 5. The packaged semiconductor device 100 is coupled to the carrier 122 to complete the fabrication of the substrate 102 in some embodiments, for example. The through-vias 128 do not extend completely through the substrate 102 in the packaging process steps shown in FIGS. 1 through 5, so the substrate 102 is thinned so that ends (i.e., the lower ends in the view shown in FIG. 6) of the through-vias 128 are exposed. Then another interconnect structure 124b is formed over the core substrate 126 and through-vias 128, with portions of the interconnect structure 124b being electrically coupled to the lower ends of the through-vias 128. The resulting substrate 102' includes the substrate 102 and interconnect structure 124b.

For example, the substrate 102 may be thinned to expose the through-vias 128 using a grinding, CMP process, and/or etch step. The resulting thickness of the substrate 102 comprises dimension $d_4$, wherein dimension $d_4$ comprises about 50 μm to about 200 μm. Dimension $d_4$ is less than dimension $d_0$ (see FIG. 1) of the initial thickness of the substrate 102, for example. The interconnect structure 124b is then formed over the thinned substrate 102. The interconnect structure 124b may comprise an RDL or PPI and may include one or more conductive line layers, via layers, and insulating layers (not shown). A passivation material may be formed over the interconnect structure 124b, not shown. The interconnect structure 124b may include a final passivation material layer, for example. The interconnect structure 124b is disposed on a lower side of the core substrate 126. Interconnect structure 124a disposed on an upper side of the core substrate 126 may comprise similar materials and components as described for interconnect structure 124b.

Electrical signals can be transmitted and received within the packaged semiconductor device 100 to and from the integrated circuit dies 104 through the connectors 106, the interconnect structure 124a, the through-vias 128, the interconnect structure 124b, and through connectors 130 coupled to the interconnect structure 124b. The through-vias 128 provide vertical electrical connections for the packaged semiconductor device 100, and the interconnect structures 124a and 124b provide horizontal electrical connections for the packaged semiconductor device 100 in some embodiments.

In some embodiments, a plurality of connectors 130 are then coupled to the substrate 102, also shown in FIG. 6. The plurality of connectors 130 is coupled to a second surface (i.e., to the bottom surface of the substrate 102 in FIG. 6) of the substrate 102 that is opposite the first surface (i.e., the top surface) of the substrate 102. The plurality of connectors 130 are coupled to contact pads or other conductive features (not shown) of the interconnect structure 124b formed on the substrate 102. The plurality of connectors 130 may comprise a eutectic material such as solder, and may comprise solder balls or C4 bumps in some embodiments. The connectors 130 may be attached using a ball drop process or a solder bath, as examples. Alternatively, the connectors 130 may comprise other types of connectors and may be attached using other methods, or the connectors 130 may not be included on the packaged semiconductor device 100.

The carrier 122 is then removed or de-bonded from the cap layer 120 or portion 120' of the cap layer 120, and the packaged semiconductor devices 100 are then singulated using a saw blade or laser along scribe lines.

Thus, FIG. 6 illustrates a novel packaged semiconductor device 100 that includes the substrate 102 or 102', a plurality of integrated circuit dies 104, and a molding material 112 disposed over the substrate 102 or 102' between adjacent integrated circuit dies 104. The cap layer 120 or portion 120' of the cap layer 120 is disposed over the molding material 112 and the plurality of integrated circuit dies 104. In some embodiments, the cap layer 120 is completely removed and is not left remaining in the structure.

In some embodiments, the cap layer 120 or portion 120' of the cap layer 120 is left remaining on the packaged semiconductor device 100 during transportation of the finished device 100. The cap layer 120 or portion 120' of the cap layer 120 protects the integrated circuits 104 during transportation, e.g., within a packaging facility, to an end user of the packaged semiconductor device 100, or to other locations. The cap layer 120 or portion 120' of the cap layer 120 may be removed at any stage of the packaging process or transportation of the packaged semiconductor device 100.

Figure 7:
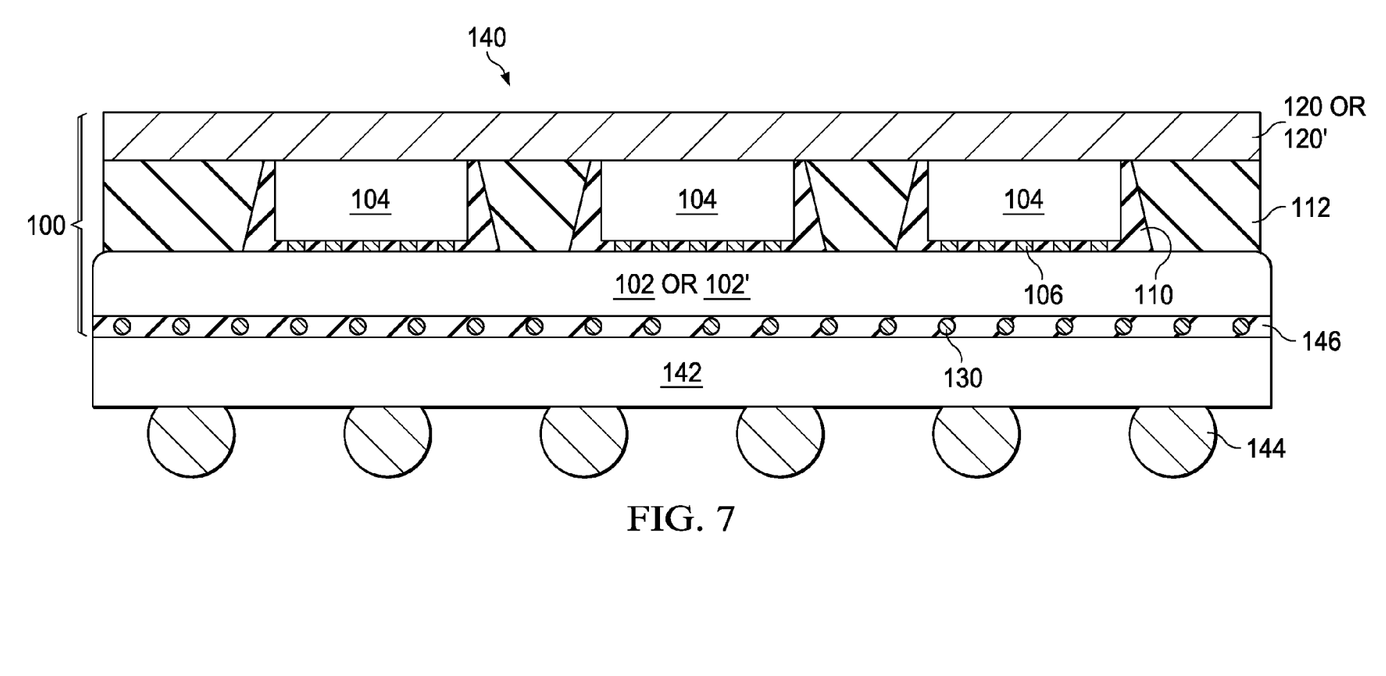
FIG. 7 is a cross-sectional view illustrating a method of packaging semiconductor devices in accordance with some embodiments, wherein the substrate comprises a first package substrate that is coupled to a second package substrate.

Other structures can likewise benefit from the packaging process flows and structures described herein. For example, FIG. 7 is a cross-sectional view of a packaged semiconductor device 100 described herein coupled to a package substrate 142 in accordance with some embodiments. The package substrate 142 is also referred to herein as a second package substrate 142. Connectors 130 of the packaged semiconductor device 100 described herein are coupled to contact pads (not shown) on the package substrate 142. A plurality of the connectors 130 are coupled between contact pads on the package substrate 142 and contact pads (also not shown) on the substrate 102 or 102'. In some embodiments, the substrate 102 or 102' comprises a first package substrate, and the first package substrate 102 or 102' is coupled to a second package substrate 142 by the plurality of connectors 130. The substrate 102 is mounted to the second package substrate 142 using a ball mount process in some embodiments. The second package substrate 142 may include a plurality of connectors 144 formed on a bottom surface thereof. The connectors 144 may comprise solder balls arranged in a ball grid array (BGA). Alternatively, the connectors 144 may comprise other types of connectors arranged in other shapes. In some embodiments, the connectors 144 are not included.

An underfill material or molding material 146 may be disposed in the space between the first package substrate 102 or 102' and the second package substrate 142 between the connectors 144, to provide stress relief and crack prevention for the connectors 144. Alternatively, the underfill material or molding material 146 may not be included.

The packaged semiconductor device 140 shown in FIG. 7 comprises a chip on wafer on substrate (CoWoS) configuration in some embodiments, for example.

Figure 8:
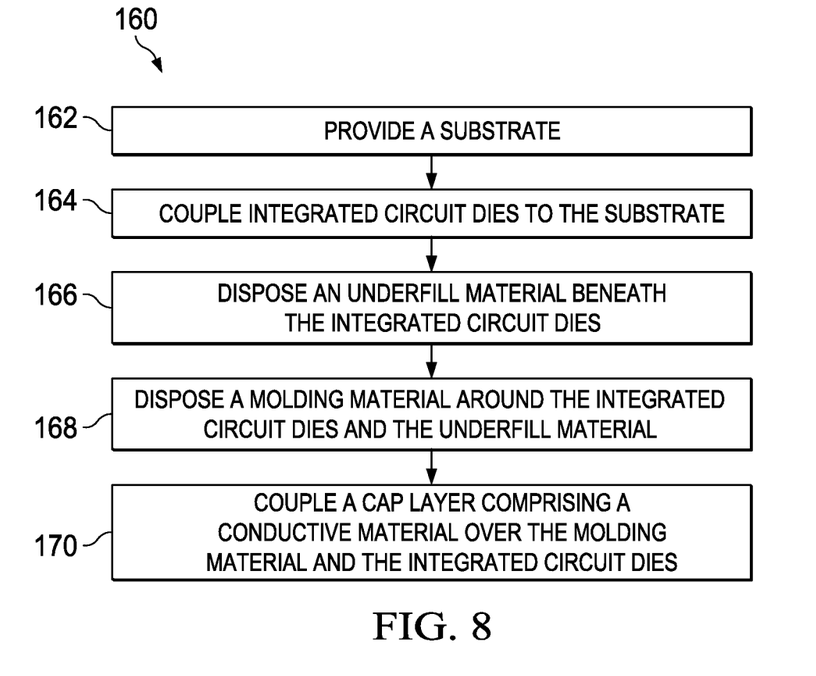
FIG. 8 is a flow chart of a method of packaging semiconductor devices in accordance with some embodiments.

FIG. 8 is a flow chart 160 of a method of packaging semiconductor devices in accordance with some embodiments. In step 162, a substrate 102 is provided (see also FIG. 1). Integrated circuit dies 104 are coupled to the substrate 102 in step 164. In step 166, an underfill material 110 is disposed beneath the integrated circuit dies 104 (FIG. 2). In step 168, a molding material 112 is disposed around the integrated circuit dies 104 and the underfill material 110 (FIG. 3). In step 170, a cap layer 120 comprising a conductive material is coupled over the molding material 112 and the integrated circuit dies 104 (FIG. 4).

Some embodiments of the present disclosure include methods of packaging semiconductor devices. Other embodiments include packaged semiconductor devices that have been packaged using the novel methods described herein.

Some advantages of embodiments of the present disclosure include providing novel substantially equal or more uniform potential structures and methods for CoW configuration package structures. The packaging structures and methods include a cap layer that is used to evenly distribute charges that can build up during processing and transportation and damage the integrated circuit dies. Thus, including the cap layer in the packaged semiconductor device and packaging process flows avoids damage to the integrated circuit dies and results in packaged semiconductor devices with increased yields.

The cap layer has a low resistance and is conductive, and is formed adjacent each integrated circuit die within the package; thus, isolation of the integrated circuit dies (which creates an unbalanced potential, which induces pulses and can damage the dies) is avoided. Damage to integrated circuit dies from EOS or ESD during the packaging process or during subsequent transportation of the finished packaged semiconductor devices is prevented.

The cap layer provides one single continuous surface of material that has lower cross-contamination, and provides equal potential among each chip and thus, provides a lower EOS risk. In some embodiments, the electrically conductive cap layer is also thermally conductive, and provides heat dissipation for the integrated circuit dies during operation.

The cap layer can be left remaining on the packaged device, or the cap layer can be removed. For example, the cap layer may be removed after transportation or after substrate backside processing. Other processes may also be performed prior to removing the cap layer. In some embodiments, even removing the cap layer can result in a thin conductive portion of the cap layer being left remaining, which further continues to protect the integrated circuit dies from EOS or ESD damage. Furthermore, the novel packaging methods and structures described herein are easily implementable in manufacturing and packaging process flows.

In some embodiments, a method of packaging semiconductor devices includes coupling a plurality of integrated circuit dies to a substrate, disposing a molding material around the plurality of integrated circuit dies, and coupling a cap layer over the molding material and the plurality of integrated circuit dies.

In some embodiments, a method of packaging semiconductor devices includes providing a substrate, and coupling a plurality of integrated circuit dies to the substrate. An underfill material is disposed beneath each of the plurality of integrated circuit dies. A molding material is disposed around the plurality of integrated circuit dies and the underfill material. A cap layer is coupled over the molding material and each of the plurality of integrated circuit dies. The cap layer comprises a conductive material.

In other embodiments, a packaged semiconductor device includes a substrate, a plurality of dies coupled over the substrate, and a molding material disposed over the substrate between adjacent ones of the plurality of dies. A cap layer is disposed over the molding material and the plurality of dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging semiconductor devices, the method comprising:
    coupling a plurality of integrated circuit dies to a substrate;
    disposing a molding material around the plurality of integrated circuit dies; and
    depositing a conductive cap layer directly over the molding material and the plurality of integrated circuit dies, the cap layer contacting one or more of the plurality of integrated circuit dies, the depositing comprising at least one of a vapor deposition process or an atomic layer deposition process.

2. The method according to claim 1, further comprising disposing an underfill material beneath the plurality of integrated circuit dies, before disposing the molding material.

3. The method according to claim 1, wherein coupling the plurality of integrated circuit dies comprises coupling the plurality of integrated circuit dies to a first surface of the substrate, and wherein the method further comprises processing a second surface of the substrate after coupling the cap layer, the second surface being opposite the first surface.

4. The method according to claim 3, wherein processing the second surface of the substrate comprises using a process selected from the group consisting essentially of: thinning the substrate, forming an interconnect structure over the substrate, forming a passivation material over the substrate, and forming a plurality of connectors over the substrate.

5. The method according to claim 3, further comprising performing a process to remove the cap layer, after processing the second surface of the substrate.

6. The method according to claim 5, wherein a portion of the cap layer is left remaining over the molding material and the plurality of integrated circuit dies, after performing the process to remove the cap layer.

7. The method according to claim 1, further comprising curing the molding material.

8. A method of packaging semiconductor devices, the method comprising:
    providing a substrate;
    coupling a plurality of integrated circuit dies to the substrate;
    disposing an underfill material beneath each of the plurality of integrated circuit dies and along on sidewalls of each of the plurality of integrated circuit dies;
    disposing a molding material around the plurality of integrated circuit dies and the underfill material; and coupling a cap layer over the molding material and each of the plurality of integrated circuit dies, wherein the cap layer comprises a metal silicide.

9. The method according to claim 8, wherein disposing the molding material further comprises disposing the molding material over top surfaces of the plurality of integrated circuit dies, and wherein the method further comprises removing the molding material from the top surfaces of the plurality of integrated circuit dies, before coupling the cap layer.

10. The method according to claim 8, wherein providing the substrate comprises providing an interposer substrate, the interposer substrate including a plurality of through-vias and an interconnect structure coupled to the plurality of through-vias.

11. The method according to claim 8, wherein coupling the cap layer comprises coupling a material having a lower resistance than a material of the plurality of integrated circuit dies and the molding material.

12. The method according to claim 8, wherein coupling the plurality of integrated circuit dies comprises coupling the plurality of integrated circuit dies to a first surface of the substrate, and wherein the method further comprises coupling a plurality of connectors to a second surface of the substrate, the second surface being opposite the first surface.

13. A method of packaging semiconductor devices, the method comprising:
coupling a plurality of integrated circuit dies to a substrate, wherein the substrate is electrically connected to the plurality of integrated circuit dies;
encapsulating the plurality of integrated circuit dies in a molding material; and
forming a cap layer over the molding material and the plurality of integrated circuit dies, wherein the cap layer comprises an electrically conductive material that directly contacts the molding material and the plurality of integrated circuit dies.

14. The method of claim 13, wherein the plurality of integrated circuit dies comprises a plurality of singulated integrated circuit dies.

15. The method of claim 13, wherein the encapsulating the plurality of integrated circuit dies in the molding material comprises disposing the molding material around and over the plurality of integrated circuit dies, and planarizing the molding material, wherein a major surface of the molding material is co-planar with major surfaces of the plurality of integrated circuit dies.

16. The method of claim 13, further comprising removing a first portion of the cap layer, wherein a second portion of the cap layer remains over the molding material and the plurality of integrated circuit dies.

17. The method of claim 13, further comprising processing a surface of the substrate facing away from the plurality of integrated circuit dies.

18. The method of claim 17, wherein the processing the surface of the substrate comprises forming a plurality of connectors at the surface of the substrate, the plurality of connectors electrically coupled to the plurality of integrated circuit dies.

19. The method of claim 17, wherein the processing the surface of the substrate comprises thinning the substrate, the thinning exposing one or more through-vias extending through the substrate.

20. The method of claim 13, further comprising disposing an underfill material beneath each of the plurality of integrated circuit dies and along on sidewalls of each of the plurality of integrated circuit dies.

* * * * *